United States Patent
Oh et al.

(10) Patent No.: US 9,305,642 B2
(45) Date of Patent: Apr. 5, 2016

(54) RESISTANCE MEMORY DEVICE AND APPARATUS, FABRICATION METHOD THEREOF, OPERATION METHOD THEREOF, AND SYSTEM HAVING THE SAME

(71) Applicant: SK hynix Inc., Gyeonggi-do (KR)

(72) Inventors: Dong Yean Oh, Gyeonggi-do (KR); Woon Ha Yim, Gyeonggi-do (KR); Mi Na Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 217 days.

(21) Appl. No.: 14/050,069

(22) Filed: Oct. 9, 2013

(65) Prior Publication Data
US 2014/0365723 A1     Dec. 11, 2014

(30) Foreign Application Priority Data
Jun. 5, 2013    (KR) .................. 10-2013-0064580

(51) Int. Cl.
G06F 12/00    (2006.01)
G11C 13/00    (2006.01)
H01L 27/10    (2006.01)

(52) U.S. Cl.
CPC .......... *G11C 13/003* (2013.01); *G11C 13/0004* (2013.01); *G11C 13/0007* (2013.01); *H01L 27/101* (2013.01); *G11C 2213/71* (2013.01); *G11C 2213/74* (2013.01); *G11C 2213/79* (2013.01)

(58) Field of Classification Search
CPC ............ G11C 13/003; G11C 13/0004; G11C 13/0007; G11C 2213/71; G11C 2213/74; G11C 2213/79; H01L 27/101
USPC .................. 711/103, 104, E12.001; 365/148
See application file for complete search history.

(56) References Cited

U.S. PATENT DOCUMENTS

| | | | |
|---|---|---|---|
| 2008/0158935 A1* | 7/2008 | Taguchi ............. | G11C 11/5685 365/148 |
| 2010/0080038 A1* | 4/2010 | Awaya ................ | G11C 11/005 365/148 |
| 2010/0165702 A1* | 7/2010 | Toda .................. | G11C 13/0011 365/148 |
| 2011/0305067 A1* | 12/2011 | Ueda ............................. | 365/148 |
| 2012/0026777 A1* | 2/2012 | Kitagawa et al. ............. | 365/148 |
| 2013/0242641 A1* | 9/2013 | Nakai ............................ | 365/148 |
| 2014/0117304 A1* | 5/2014 | Park ................................ | 257/4 |

FOREIGN PATENT DOCUMENTS

| | | |
|---|---|---|
| KR | 100480644 | 3/2005 |
| KR | 101016958 | 2/2011 |

* cited by examiner

*Primary Examiner* — Pierre-Michel Bataille
(74) *Attorney, Agent, or Firm* — IP & T Group LLP

(57) ABSTRACT

Resistance memory device and apparatus, a fabrication method thereof, an operation method thereof, and a system including the same are provided. The resistance memory device may include a data storage unit and a first interconnection connected to the data storage unit. A first access device may be connected in series with the data storage unit and a second access device may be connected in series with the first access device. A second interconnection may be connected to the second access device. A third interconnection may be connected to the first access device to drive the first access device and a fourth interconnection connected to the second access device to drive the second access device.

27 Claims, 17 Drawing Sheets

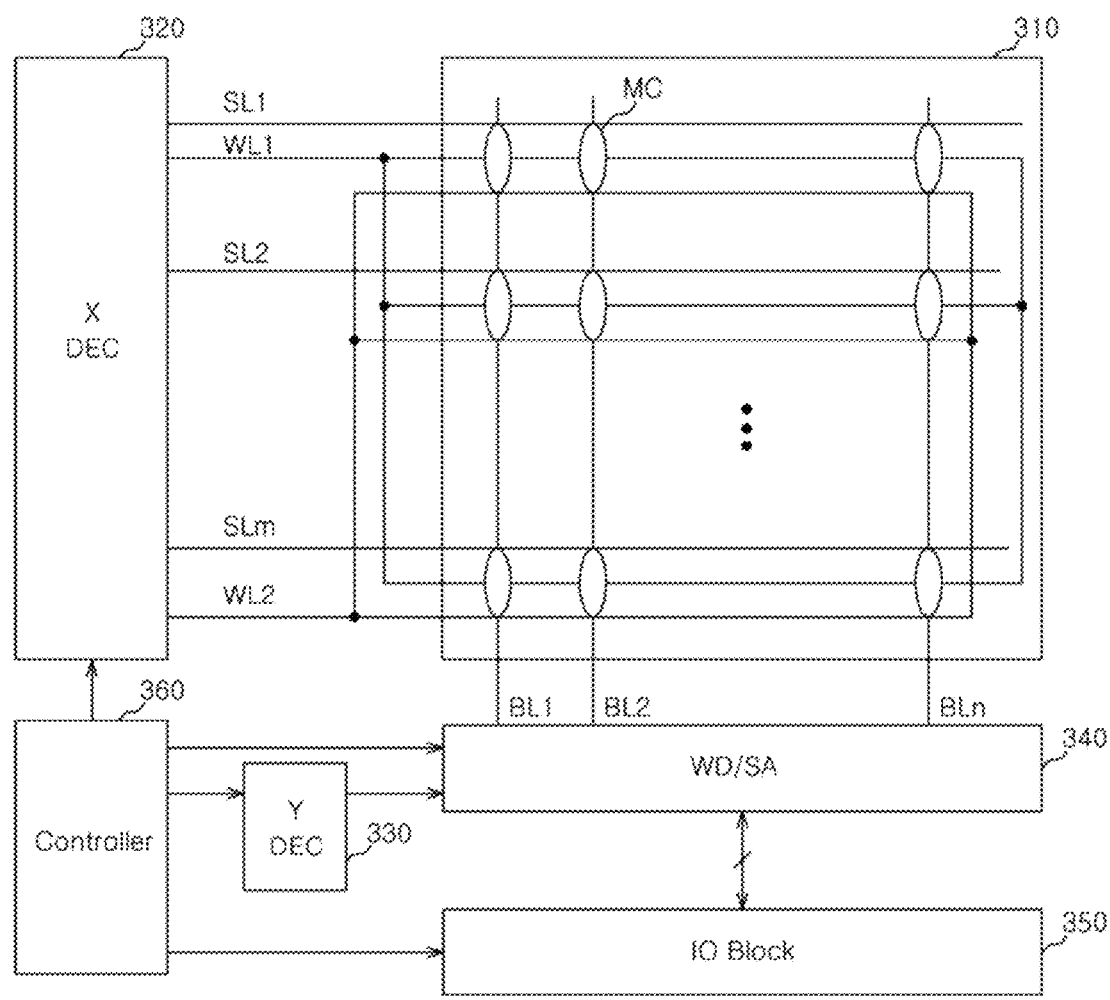

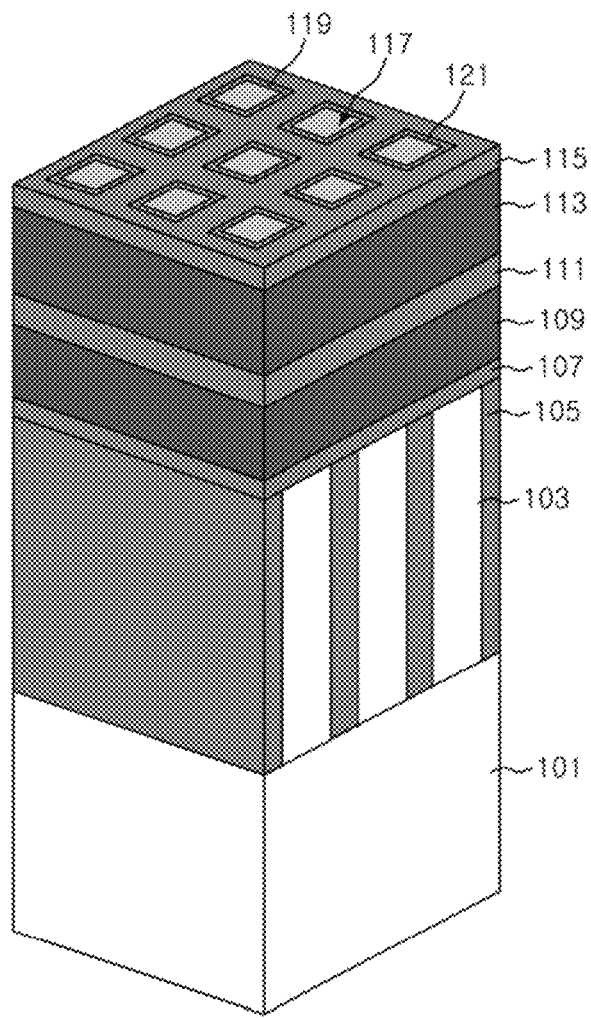

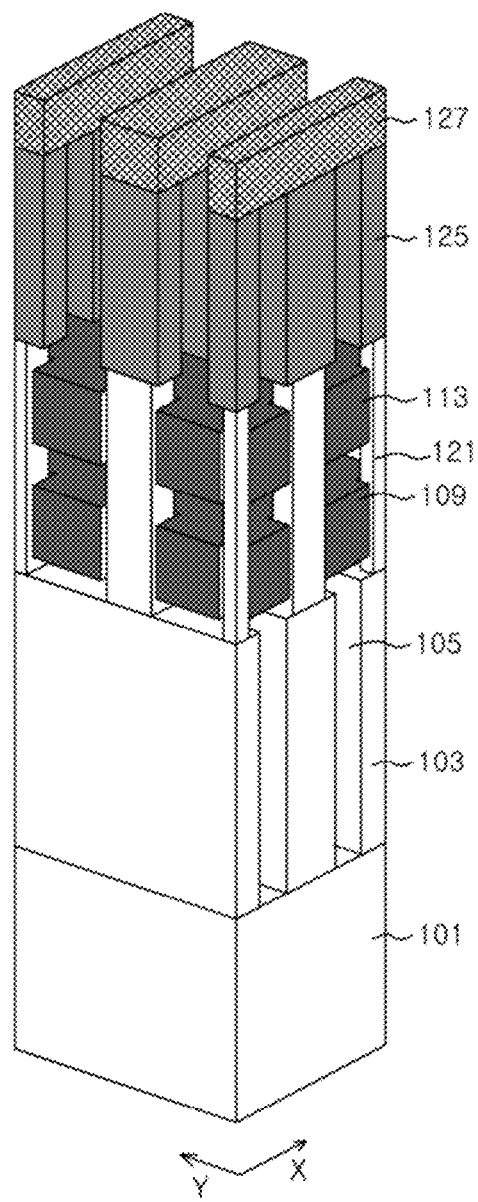

RESISTANCE MEMORY DEVICE AND APPARATUS, FABRICATION METHOD THEREOF, OPERATION METHOD THEREOF, AND SYSTEM HAVING THE SAME

CROSS-REFERENCES TO RELATED APPLICATION

The present application claims priority under 35 U.S.C. 119(a) to Korean application number 10-2013-0064580, filed on Jun. 5, 2013, in the Korean Intellectual Property Office, which is Incorporated herein by reference in its entirety.

BACKGROUND

1. Technical Field

Various implementations of the inventive concept relate to a semiconductor integrated circuit, and more particularly, to resistance memory device and apparatus, a fabrication method thereof, an operation method thereof, and a system having the same.

2. Related Art

Electronic apparatuses need semiconductor devices with ultra-high integration, ultra-high speed, and ultra-low power, and thus various attempts to memory devices which may replace dynamic random access memories (DRAMs) or flash memories have been widely made.

Resistance memory devices have received attentions as next-generation memory devices, and are devices which store data by selecting a cell through an access device, and changing a resistance state of a data storage unit electrically connected to the selected cell. That is, the resistance memory devices use a resistance variable material of which a resistance is sharply changed according to an applied voltage to switch at least two different resistance states. There are typically phase-change RAMs (PCRAMs), resistance RAMs (ReRAMs), or magentoresistive RAMs (MRAMs) as the resistance memory devices.

The resistance memory devices employ a diode or a transistor as an access device. In recent years, various attempts of promoting high integration using a three-dimensional (3D) structure transistor or promoting low power with the high integration by introducing a horizontal channel transistor have been made.

As described above, the resistance memory devices may be variously used as next-generation devices, and there is a need for methods for fabricating and driving the resistance memory devices more efficiently.

SUMMARY

An exemplary resistance memory device may include a data storage unit; a first interconnection connected to the data storage unit; a first access device connected in series with the data storage unit; a second access device connected in series with the first access device; a second interconnection connected to the second access device; a third interconnection connected to the first access device to drive the first access device; and a fourth interconnection connected to the second access device to drive the second access device.

An exemplary memory apparatus may include a resistance memory cell array including a plurality of memory cells, each memory cell comprising a data storage connected to a bit line, and a first access device and a second access device, connected in series with the data storage unit, and between the data storage unit and a source line, wherein the first access device is configured to be driven by a signal applied to a first word line and the second access device is configured to be driven by a signal applied to a second word line; a controller configured to control a write operation and a read operation to a selected memory cell of the resistance memory cell array; and a read/write control circuit configured to select at least one memory cell, of the resistance memory cell array, in response to the controller and to perform the write operation or the read operation.

An exemplary method of operating a resistance memory apparatus which may include a resistance memory cell array including a resistance memory cell array including a data storage unit, of which one end is connected to a bit line, and a first access device and a second access device, connected in series between another end of the data storage unit and a source line and configured to be driven according to signals applied to a first word line and a second word line, as a unit memory cell; and a controller configured to control a write operation and a read operation to a selected memory cell among the resistance memory cell array, the method comprising supplying a voltage, having a first level, to the bit line, the source line, the first word line, and the second word line; supplying a first power voltage, having a level higher than the first level, to the first word line; supplying a voltage, having a level lower than the first level, to the second word line; supplying a second power voltage, having a level higher than the first power voltage, to a selected bit line; supplying the voltage having the first level to a selected source line; and accessing a selected memory cell by supplying the voltage of the first level to a non-selected bit line, and supplying a voltage of a second level that is lower than the first power voltage and higher than the first level to a non-selected source line.

An exemplary method of fabricating a resistance memory device. The method may include sequentially forming a first conductive material, a first interlayer insulating layer, a second conductive material, and a second interlayer insulating layer on a semiconductor substrate in which a source line is formed; patterning the first conductive material and the second conductive material and the first interlayer insulating layer and the second interlayer insulating layer to form a plurality of first holes exposing an upper surface of the source line; forming a gate insulating layer on an inner wall defining each of the first holes; forming a channel region in each of the first holes in which the gate insulating layer is formed; forming a junction region by implanting an impurity in an upper portion of the channel region; forming a third interlayer insulating layer on the semiconductor substrate, including the junction region; patterning the third interlayer insulating layer to form second holes exposing an upper portion of the junction region; forming a data storage unit in an inside of the second holes; and forming a bit line to be electrically connected to the data storage unit.

An exemplary data processing system may include a controller configured to perform decryption of a command received from an external source; an interface configured to communicate the command or data to be exchanged between the external source and the controller; a main storage apparatus configured to store an application, a control signal, or data; and an auxiliary storage apparatus configured to store a program code or data, wherein any one of the main storage apparatus or the auxiliary storage apparatus comprises a resistance memory apparatus including a resistance memory cell array having a data storage unit of which one end is connected to a bit line, and a first access device and a second access device connected in series between the other end of the data storage unit and a source line and configured to be driven according to signals applied to a first word line and a second word line, as a unit memory cell.

An exemplary data processing system may include a resistance memory apparatus including a resistance memory cell array, and a controller configured to control an operation of the resistance memory cell array; and a memory controller configured to access the resistance memory apparatus in response to request of a host, wherein the memory cell array includes a data storage unit connected to a bit line, and a first access device and a second access device, which form a memory cell unit, connected in series between the data storage unit and a source line, wherein the first access device is configured to be driven by a signal applied to a first word line, and the second access device is configured to be driven by a signal applied to a second word line.

An exemplary electronic system may include a processor configured to perform decryption of a command received from an external source; an operation memory configured to store an application, data, or a control signal required for an operation of the processor; a resistance memory apparatus including a memory cell array configured to be accessed by the processor, and a controller configured to control an operation of the memory cell array; and a user interface configured to input/output data between the processor and a user, wherein the memory cell array may include a data storage unit connected to a bit line, and a first access device and a second access device, which form a memory cell unit, connected in series between the data storage unit and a source line, wherein the first access device is configured to be driven by a signal applied to a first word line, and the second access device is configured to be driven by a signal applied to a second word line.

These and other features, aspects, and implementations are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which:

FIG. 7 illustrates a configuration of an exemplary resistance memory apparatus;

FIGS. 8A to 8G illustrates an exemplary method of fabricating a resistance memory device;

FIG. 9 is a perspective view illustrating an exemplary resistance memory device;

DETAILED DESCRIPTION

Figure 1:
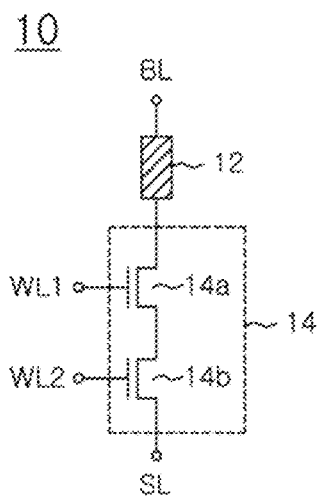
FIG. 1 is a structure diagram illustrating an exemplary resistance memory device.

Hereinafter, exemplary implementations will be described in greater detail with reference to the accompanying drawings.

Exemplary implementations are described herein with reference to cross-sectional illustrations that are schematic illustrations of exemplary implementations (and intermediate structures). As such, variations from the shapes of the illustrations as a result, for example, of manufacturing techniques and/or tolerances, are to be expected. Thus, exemplary implementations should not be construed as limited to the particular shapes of regions illustrated herein but may be to include deviations in shapes that result, for example, from manufacturing. In the drawings, lengths and sizes of layers and regions may be exaggerated for clarity. Throughout the disclosure, reference numerals correspond directly to the like numbered parts in the various figures and embodiments of the present invention. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

FIG. 1 is a structure diagram illustrating an exemplary resistance memory device.

Referring to FIG. 1, a resistance memory device 10 may include a data storage unit 12 of which one end is connected to a first interconnection BL, and a plurality of access devices 14 connected in series between the other end of the storage unit and a second interconnection SL and configured to be driven by signals applied to a third interconnection WL1 and a fourth interconnection WL2.

The data storage unit 12 may be configured using a variable resistor element. For example, the data storage unit 12 may include a chalcogenide-based compound such as Gallium-selenium-tellurium (GST), transition metal oxide, a ferroelectric material, a ferromagnetic material, perovskite, or the like, but the material for the data storage unit 12 is not limited thereto. That is, the data storage unit 12 may be configured using a material that has a variable resistance characteristic to switch different resistance states according to a voltage or current applied to both ends thereof.

For example, the access device 14 may be configured to connect a pair of transistors in series. FIG. 1 illustrates an example in which the access device 14 is implemented using an NMOS transistor.

The access device 14 may include a first access device 14a of which one end is connected to the other end of the data storage unit 12 and configured to be driven by a voltage applied to the third interconnection WL1, that is, a first word line WL1, and a second access device 14b connected between the other terminal of the first access device and the second interconnection SL and configured to be driven by a voltage applied to the fourth interconnection WL2, that is, a second word line WL2.

Figure 2:
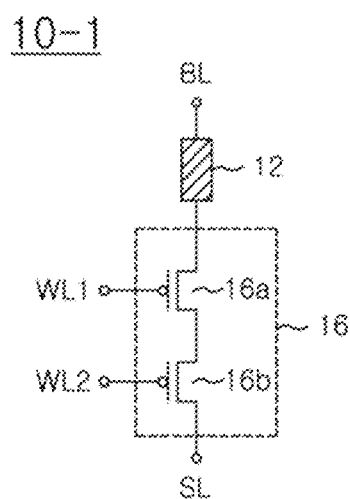
FIG. 2 is a structure diagram illustrating an exemplary resistance memory device.

FIG. 2 is a structure diagram illustrating an exemplary resistance memory device.

As can be seen from FIG. 2, an access device 16 of a resistance memory device 10-1 may be implemented with PMOS transistors 16a and 16b.

The access device is not limited to the examples illustrated in FIGS. 1 and 2. The access device may adopt any type that is implemented to be driven by the first word line WL1 and the second word line WL2.

Figure 3:
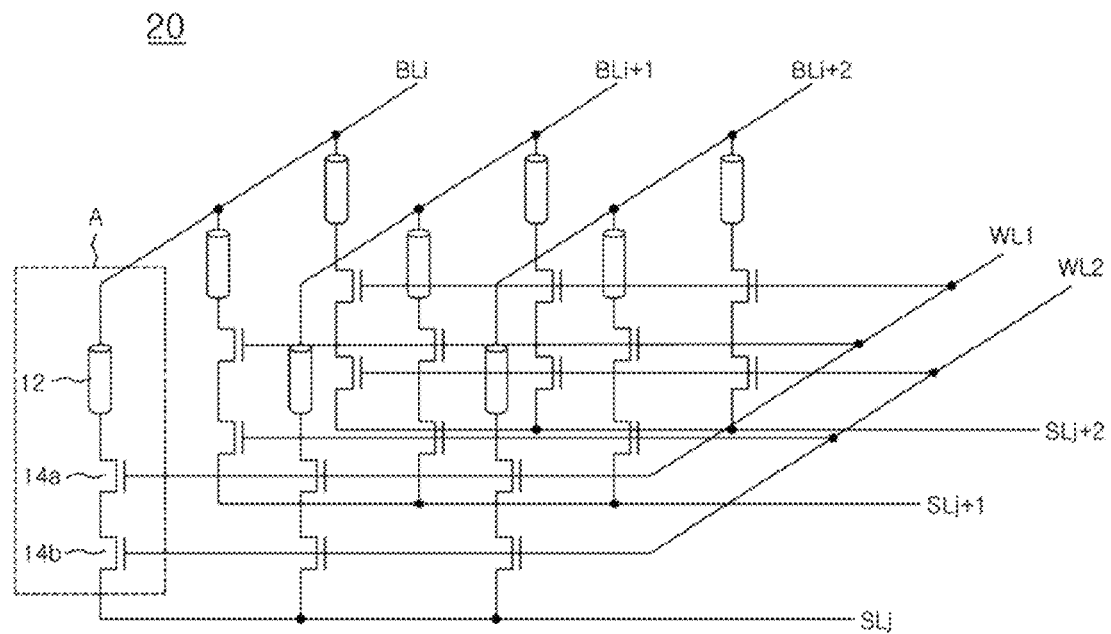
FIG. 3 is a structure diagram Illustrating an exemplary resistance memory cell array.

FIG. 3 is a structure diagram illustrating an exemplary resistance memory cell array.

Referring to FIG. 3, a resistance memory cell array 20 may is include a plurality of memory cells connected between a plurality of bit lines BLi, BLi+1, and BLi+2 (hereinafter, referred to as BL) and a plurality of source lines SLj, SLj+1, and SLj+2 (hereinafter, referred to as SL). Each of the memory cells may have the same structure as the resistance memory device of FIG. 1 or 2. In particular, FIG. 3 illustrates an example in which a pair of access devices 14a and 14b are implemented with an NMOS transistor. A first access device 14a of the pair of access devices close to the data storage unit 12 may be driven by the first word line WL1, and a second access device 14b close to the to the source line SL may be driven by the second word line WL2.

In all the memory cells included in the resistance memory cell array 20 according to an example, the first access devices 14a may be driven by the first word line WL1, and the second access devices 14b may be driven by the second word line WL2 (hereinafter, WL1 and WL2 are referred to as WL). That is, the first word line WL1 may be commonly connected to the first access devices 14a, and the second word line WL2 may be commonly connected to the second access devices 14b.

Therefore, a random access operation for accessing a specific memory cell may be performed by appropriately controlling voltage conditions applied to the bit line BL, the word line WL, and the source line SL.

Figure 4:
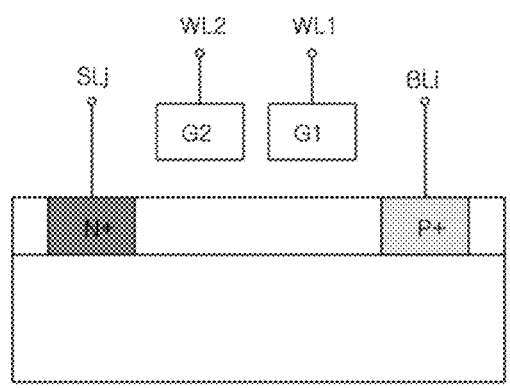
FIG. 4 is a conceptual diagram illustrating an exemplary resistance memory device.
Figure 5:
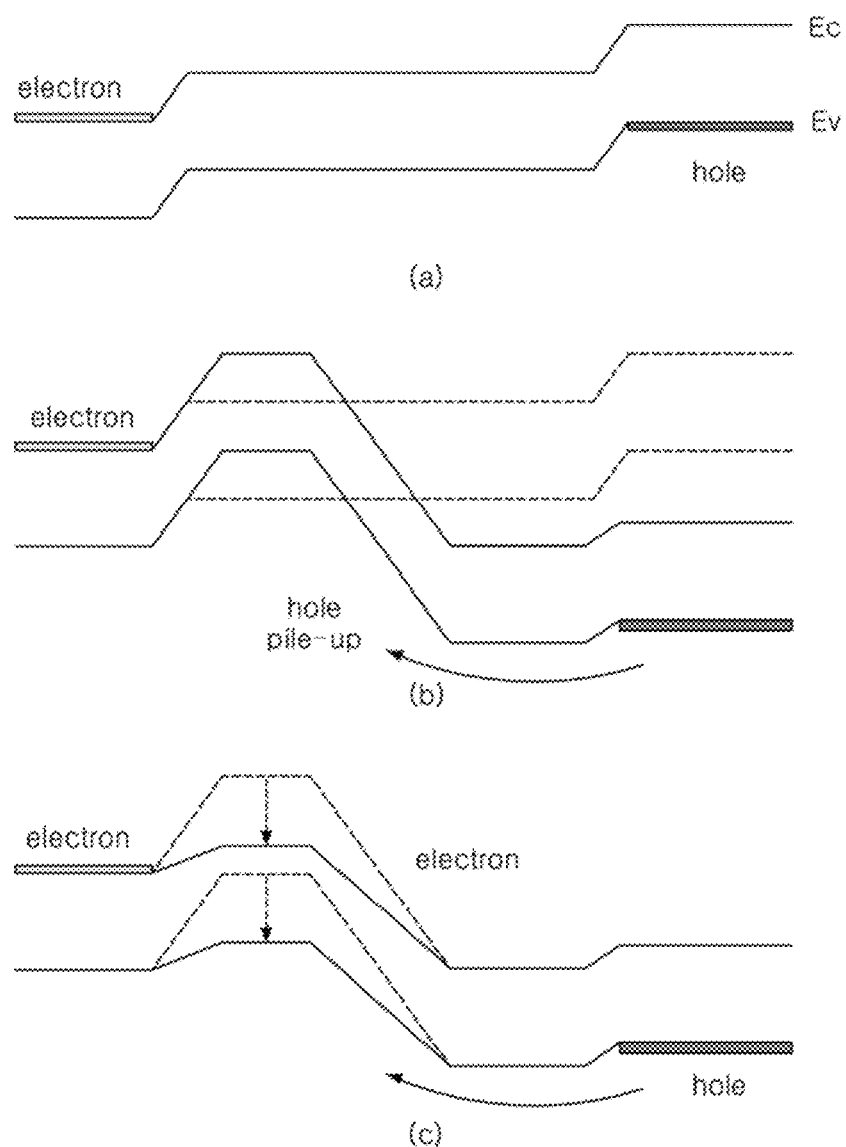
FIGS. 5(a)-5(c) are views explaining an operation principle of an exemplary resistance memory device.

FIG. 4 is a conceptual diagram of an exemplary resistance memory device, and FIG. 5 is a view explaining an operation principle of an exemplary resistance memory device.

In the exemplary implementation, an example in which the random access operation for a specific cell A in the memory cell array 20 of FIG. 3 is performed will be described.

As illustrated in FIG. 4, the exemplary resistance memory device may be represented by including a pair of gate electrodes G1 and G2 formed to be spaced by a predetermined interval on a semiconductor substrate, a first junction region P+ formed in a semiconductor layer at one side of the pair of gate electrodes G1 and G2, and a second junction region N+ formed in the semiconductor layer at the other side of the pair of gate electrodes G1 and G2. A bit line BLi may be connected to the first junction region P+ adjacent to a first gate electrode G1, and a source line SLj may be connected to the second junction region N+ adjacent to a second gate electrode G2. A first word line WL1 may be connected to the first gate electrode G1, and a second word line WL2 may be connected to the second gate electrode G2.

An access operation to the memory cell A will be described with reference to FIG. 5.

First, when voltage levels applied to the bit line BLi, the source line SLj, and the first and second word lines WL1 and WL2 are a ground voltage level, there is no current flow. It can be seen from FIG. 5(a) that an electron and a hole are in a thermal equilibrium state in an energy band diagram Ec of the electron and an energy band diagram Ev of the hole under the voltage condition.

In this state, a negative (−) voltage is supplied to the second word line WL2, a first power voltage is supplied to the first word line WL1, a second power voltage is supplied to a selected bit line BLi, and a voltage applied to the source line SLj is maintained at a ground voltage level. Here, the first power voltage has a level lower than that of the second power voltage. Therefore, holes provided in the bit line BLi are piled up in a channel region between the second word line WL2 and the semiconductor layer. FIG. 5(b) illustrates an energy band diagram under this state.

A potential of the channel region between the second word line WL2 and the semiconductor layer is increased by the piled holes, electrons in a region of the source line SLj move to a region of the bit line BLi, and thus current between the bit line BLi and the source line SLj flows. FIG. 5(c) illustrates an energy band diagram under this state.

The selected memory cell A is accessed by the above-described voltage condition, non-selected memory cells are not accessed by applying a ground voltage to the bit line and applying a low voltage higher than a ground voltage and lower than the first power voltage to the source line. That is, a voltage is applied to the selected memory cell A so that a potential difference between the bit line BLi and the second word line WL2 becomes 0V or more, and a voltage is applied to the non-selected memory cells so that a potential difference between the second word line WL2 and the source line SLj becomes less than 0V, and a potential difference between the first word line WL1 and the bit line BLi becomes 0V or more. Therefore, the access device 14 of the selected memory cell A is turned on, and access devices of the non-selected memory cells are turned off.

When a program operation is performed on the selected memory cell, the second power voltage is applied to a bit line as a first program voltage to store a set state, that is, data of a logic 0 level, and a voltage of a ground voltage level to the bit line as a second program voltage to store a reset state, that is, data of a logic 1 level. When a read operation is performed, a read voltage having an intermediate level between the first program voltage and the second program voltage to a selected bit line.

In an example, it may be set that the first power voltage is 3 V, the second power voltage 5V, the read voltage is 2V, the negative (−) voltage is −1V, and the low voltage is 1V, but the voltages are not limited thereto.

Figure 6:
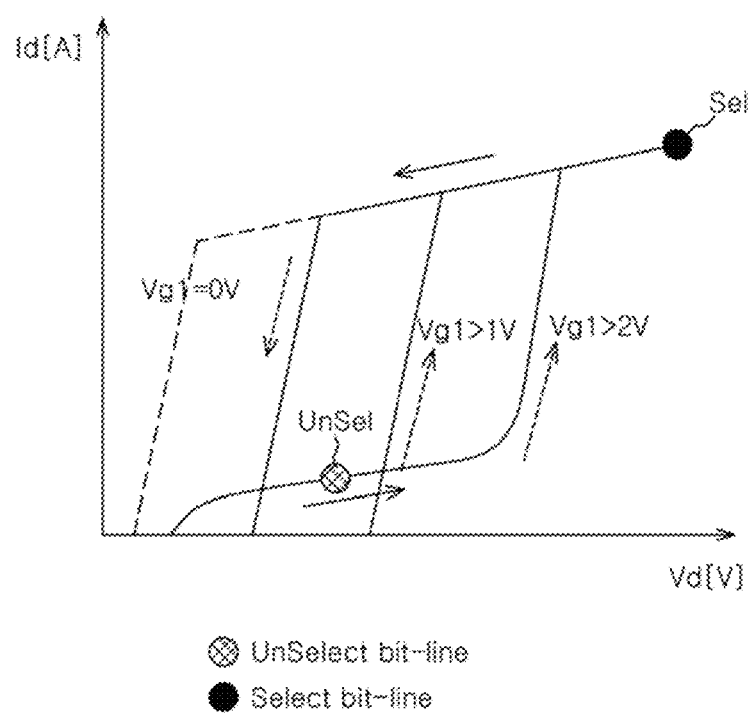
FIG. 6 is a view explaining a current-voltage characteristic of an exemplary resistance memory device.

FIG. 6 a view illustrating a current-voltage characteristic according to an operation of a resistance memory device according to an example.

In a resistance memory cell array according to an exemplary implementation, the access devices commonly use the first word line WL1 and the second word line WL2. Therefore, to access a specific memory cell, voltage conditions of the source line and the bit line need to be changed. When there is no access to all cells, all interconnections WL1, WL2, BLi to BLn, and SL1 to SLm have a ground voltage level. When there is any access to a specific cell, a high level voltage is applied to a bit line BL to which the cell is connected, a voltage which is higher than the ground voltage level and lower than the high level voltage is applied to a source line SL to which non-selected cells are connected.

As the voltage applied to a bit line is increased, an access device in a selected memory cell Sel is turned on to flow a large amount of current from the source line SL to the bit line BL, and an access device in a non-selected memory cell Unsel maintains a turn-off state not to flow current.

The access operation for the specific memory cell has been described, but the example is not limited thereto, and an access in page units may also be possible. One page in the resistive memory apparatus may be referred to as memory cells connected to one source line.

For example, in the resistance memory cell array 20 illustrated in FIG. 3, an example in which an access in page units with respect to cells connected to the source line SLj is performed will be described.

To this end, the negative (−) voltage is applied to the second word line WL2, the first power voltage is applied to the first word line WL1, the second power voltage is applied to the bit lines BL1 to BLn, and a voltage applied to the selected source line SLj is maintained at the ground voltage level. Thus, a potential in a channel region between the second word line WL2 and a semiconductor layer is increased, and electrons in a region of the selected source line SLj move to regions of the bit lines BL1 to BLn to flow current between the bit lines BL1 to BLn and the source line SLj.

Memory cells connected to the selected source ling SLj are accessed the above-described voltage condition, and non-selected source lines are not accessed by applying a low voltage, which is higher than the ground voltage and lower than the first power voltage, thereto.

When a program operation for a selected page is performed, the second power voltage may be applied to a bit line to program the selected page to the set state, and the ground voltage may be applied to the bit line to program the selected page to the reset state. When a read operation for a selected page is performed, the read voltage (an intermediate level between the first power voltage and the second power voltage) may be applied to the bit line.

FIG. 7 illustrates a configuration of an exemplary resistance memory apparatus.

Referring to FIG. 7, an exemplary resistance memory apparatus may include a memory cell array 310, a row decoder (X-DEC) 320, a column decoder (Y-DEC) 330, a read/write control circuit (WD/SA) 340, an input/output circuit block 350, and a controller 360.

The memory cell array 310 may be configured, for example, using a resistance memory cell array illustrated in FIG. 3. Therefore, each of a plurality of memory cells in the memory cell array 310 may include a pair of access devices connected in series between a data storage unit and a source line. First access devices located in a side of the data storage unit are commonly connected to the first word line WL1, second access devices located in a side of the source line are commonly connected to the second word line WL2.

The row decoder 320 and the column decoder 330 may receive external addresses, and decode a row address and a column address to be accessed in the memory cell array 310, that is, a bit line address and a source line address under control of the controller 360.

The read/write control circuit 340 may receive data from the input/output circuit block 350 and may program the data in the memory cell array 310 under control of the controller 360 or may provide data read out from a selected memory cell of the memory cell array 310 to the input/output circuit block 350 under control of the controller 360.

To access a specific memory cell or a specific page, the controller 360 may provide, for example, the first power voltage of about 3 V to the first word line WL1 and the negative voltage to the second word line WL2. The controller 360 may provide the ground voltage to a source line connected to a memory cell to be selected and a voltage which is lower than the first power voltage and higher than the ground voltage level, for example, a low voltage of about 1 V non-selected source lines. The controller 360 may provide, for example, the second power voltage to a bit line to which the memory cell to be selected and the ground voltage to non-selected bit lines.

When the access to the specific cell or the specific page is made by the voltage condition, a program operation or a read operation may be performed by applying the program voltage or the read operation to a bit line.

FIGS. 8A to 8G illustrate an exemplary method of fabricating a resistance memory device.

Figure 8A:
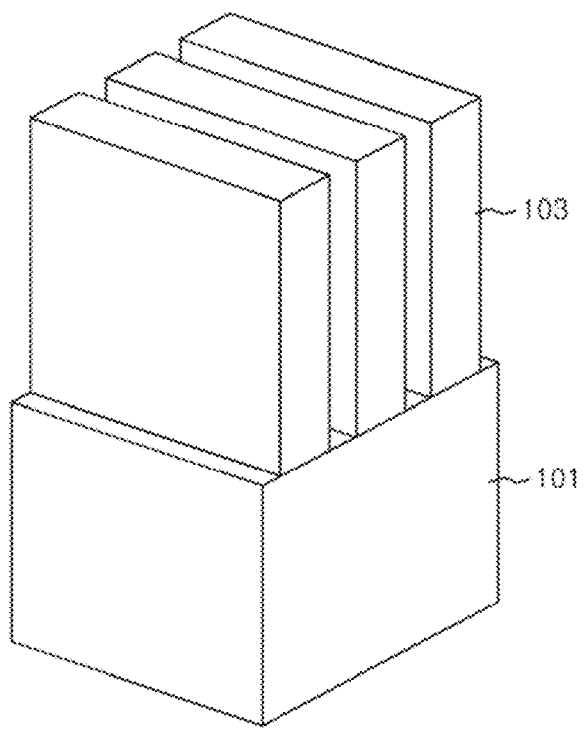

First, as illustrated in FIG. 8A, a plurality of source lines 103 having a predetermined height in a direction substantially perpendicular to a semiconductor substrate 101 are formed on the semiconductor substrate 101 in a line type. The source lines 103 may be formed to be spaced at a predetermined interval and may be formed by performing an epitaxial growth method on the semiconductor substrate 101 and then patterning the semiconductor substrate in a line type. That is, each the source lines 130 may be formed to extend to predetermined direction.

Figure 8B:
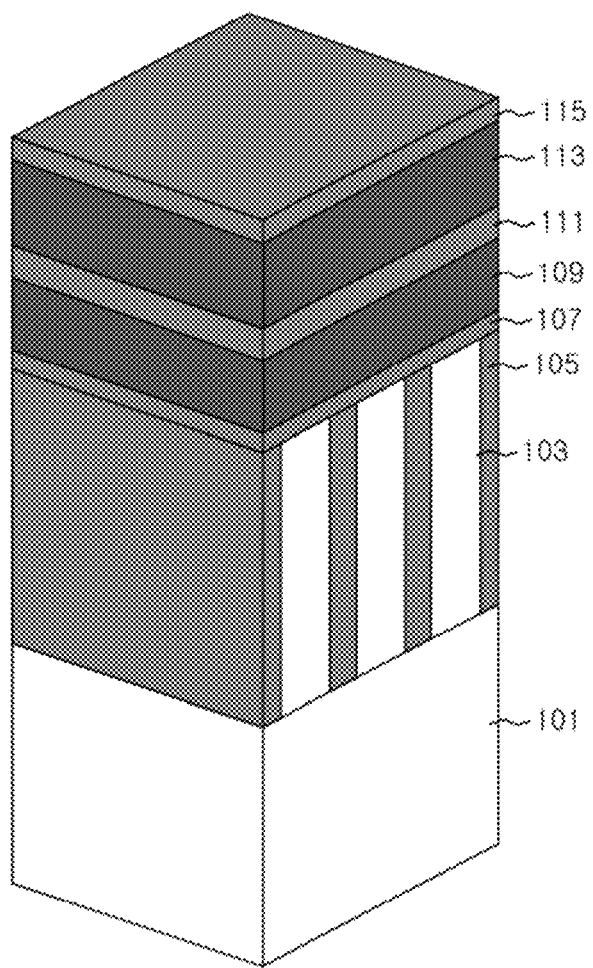

When the source lines 103 are formed, as illustrated in FIG. 8B, insulating layers 105 and 107 may be formed between the source lines and on the source lines, and a first conductive material 109, a first interlayer insulating layer 111, a second conductive material 113, and a second interlayer insulating layer 115 are sequentially formed on the insulating layer 107.

Figure 8C:
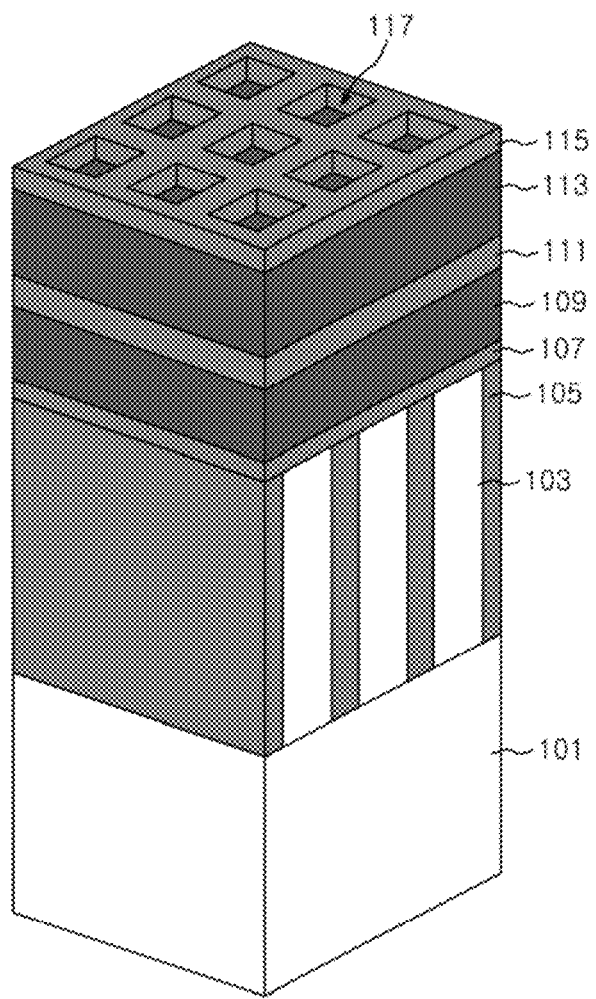

As illustrated in FIG. 8C, the second interlayer insulating layer 115, the second conductive material 113, the first interlayer insulating layer 111, the first conductive material 109, and the insulating layer 107 may be etched to form a plurality of holes 117 exposing an upper surface of the source line 103. It can be seen from FIG. 8C that the holes have a predetermined spacing. The space between the holes 117 may be determined as a distance for preventing interference between cells.

Figure 8D:
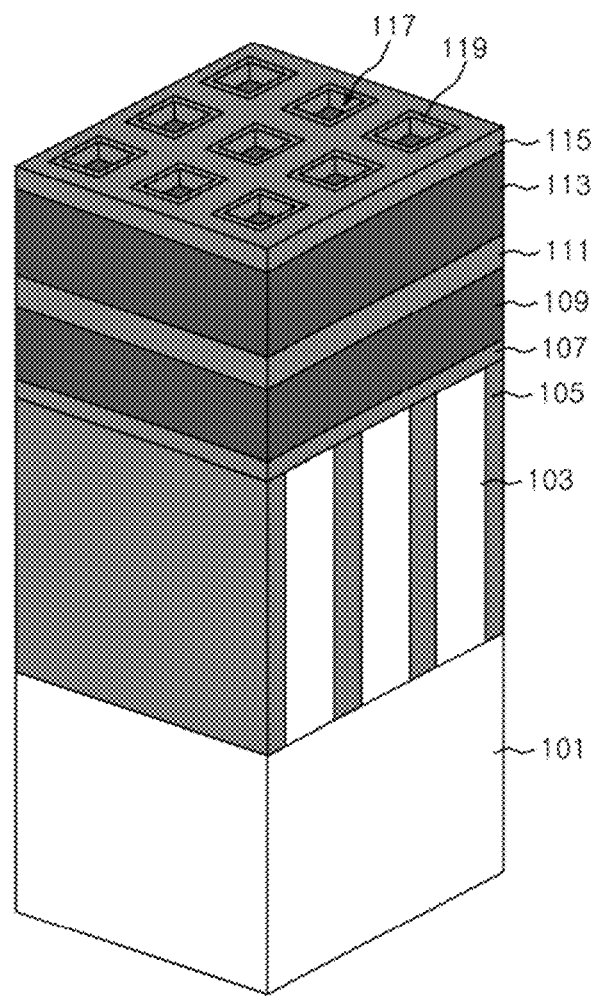

As illustrated in FIG. 8D, a gate insulating layer 119 may be formed on inner wall defining each of the plurality of holes 117.

As illustrated in FIG. 8E, a channel region 121 may be formed inside each of the holes in which the gate insulating layer 119 is formed. The channel region 121 may be formed through an epitaxial growth method or by burying a doped silicon layer in the inside of each of the holes 117. After the channel region 121 is formed, an impurity may be implanted into an upper portion of the channel region to allow the implanted region to function as a junction region (a drain region).

Figure 8F:
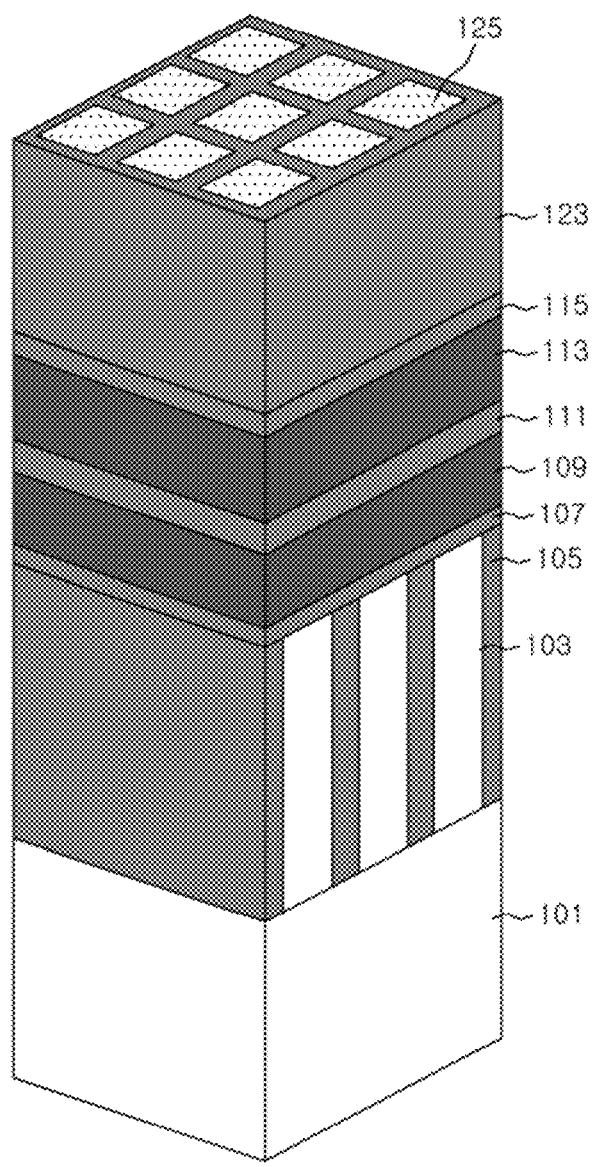

As illustrated in FIG. 8F, a third interlayer Insulating layer 123 is formed on the semiconductor substrate, including the junction region in the upper portion of the channel region 121, and then patterned to form holes exposing the junction region in the upper portion of the channel region 121. A data storage unit 125 is formed in each of holes formed in the third interlayer insulating layer 123.

The data storage unit 125 may formed using a resistance variable material. The data storage unit 125 may be formed using a heating electrode and a phase-change material, such as GST or using perovskite, metal oxide, or the like.

Figure 8G:
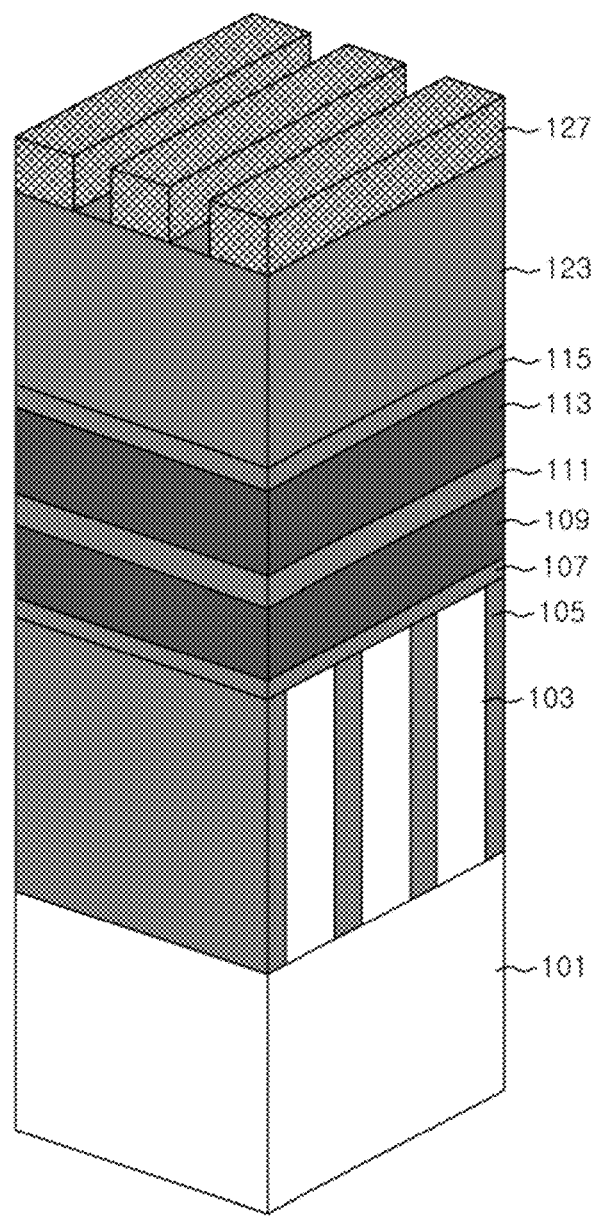

After the data storage unit 125 is formed, as illustrated in FIG. 8G, a bit line 127 may be formed on the data storage unit 125 in a direction perpendicular to the source line 103.

Figure 10A:
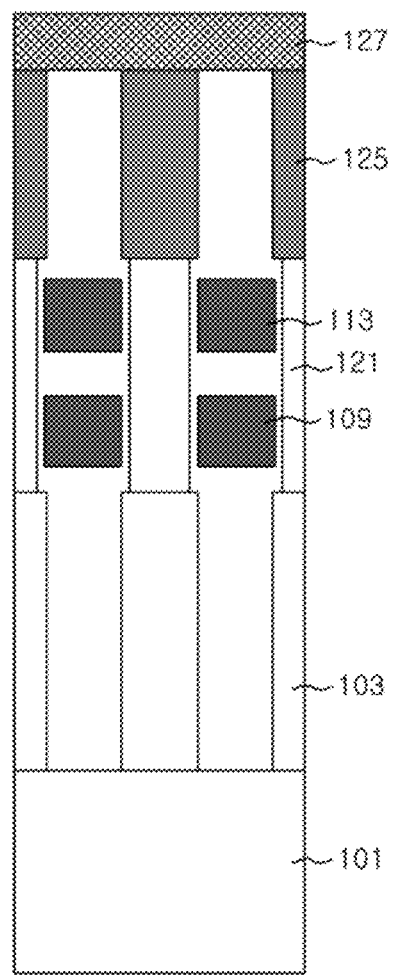
FIGS. 10a and 10b are cross-sectional views illustrating an exemplary resistance memory device.
Figure 10B:
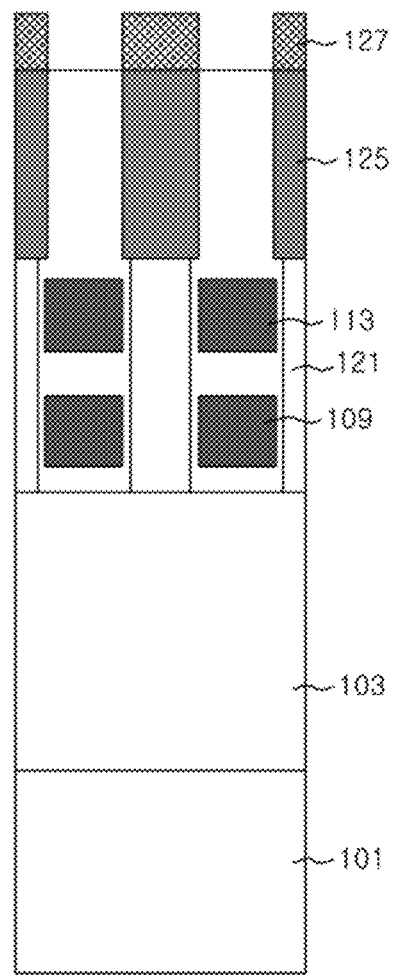

FIG. 9 is a perspective view illustrating an exemplary resistance memory device. FIGS. 10a and 10b are cross-sectional views illustrating a resistance memory device according to an example. FIG. 10A is a cross-sectional view taken along an X-direction of the perspective view of FIG. 9, and FIG. 10B is a cross-sectional view taken along a Y-direction of the perspective view of FIG. 9.

A first conductive material 109 and a second conductive material 113 may be formed around a channel region 121 that extends upward from a source line 103. The first conductive material 109, which is located close to a side of the source line 103, may function as a second word line, and the second conductive material 113, which is located close to a side of a bit line 127, may function as a first word line. Therefore, the first conductive material 109 and the second conductive material 113 form a pair of access devices.

A data storage unit 125 may be formed on a channel region 121, and the access devices may be turned on/off according to voltages applied to the bit line 127, the source line 103, and the first and second conductive materials 109 and 113. A program operation and a read operation may be performed on a selected memory cell through an access device turned on.

It can be seen from FIGS. 8A to 8G that when the resistance memory device according to an example is fabricated, a word line separation process is not accompanied. Therefore, the word line separation process may be omitted when a semiconductor memory device with ultra-high integration is fabricated, and a complicated contact process, an interconnection layout, and the like for controlling the separated word lines are not necessary.

Figure 11:
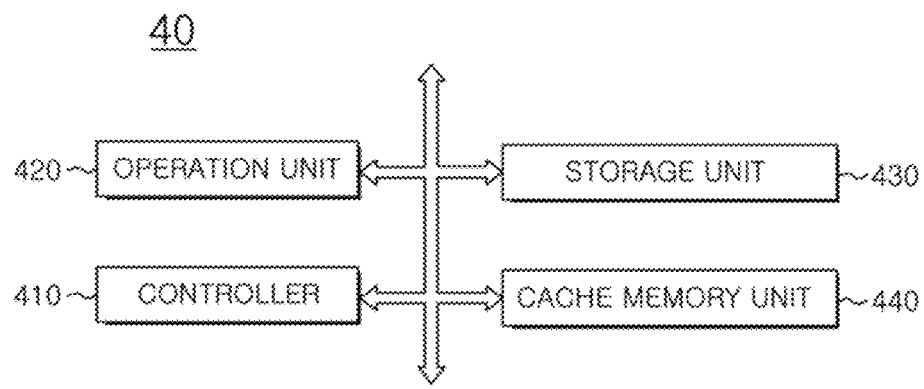
FIG. 11 illustrates a configuration of an exemplary processor.

FIG. 11 illustrates a configuration of an exemplary processor.

Referring to FIG. 11, a processor 40 may include a controller 410, an operation unit 420, a storage unit 430, and a cache memory unit 440.

The controller 410 may control an overall operation of the processor 40, such as an operation of receiving a signal from the outside and performing decryption or extraction of a command, input, output or processing of data, or the like.

The operation unit 420 may perform a variety of the four fundamental arithmetic operations or logic operations according to a decryption result of the command. The operation unit 420 may include at least one arithmetic and logic unit (ALU).

The storage unit 430 may function as a register, and may store data in the processor 40. The storage unit 430 may include a data register, an address register, or a floating-point register. The storage unit 430 may include various registers other than the above-described registers. The storage unit 430 may store addresses in which data for performing an operation in the operation unit 420, operation-processed data, or data to be operation-processed.

The storage unit 430 may be implemented by introducing the resistance memory apparatus illustrated in FIG. 7, including the resistance memory device illustrated in FIG. 1 or 2. In other words, the storage unit 430 may be a memory apparatus having a structure in which a memory device, which may include a data storage unit of which one end is connected to a bit line and first and second access devices connected in series between the data storage unit and a source line and configured to be driven by first and second word lines, respectively, is formed as a unit memory cell, the first word lines are commonly connected to first access devices of memory cells, and the second word lines are commonly connected to second access devices of the memory cells.

The cache memory unit 440 may functions as a temporary storage space.

The processor 40, illustrated in FIG. 11, may be a central processing unit (CPU), a graphic processing unit (GPU), a digital signal processor (DSP), an application processor (AP), or the like, of an electronic apparatus.

Figure 12:
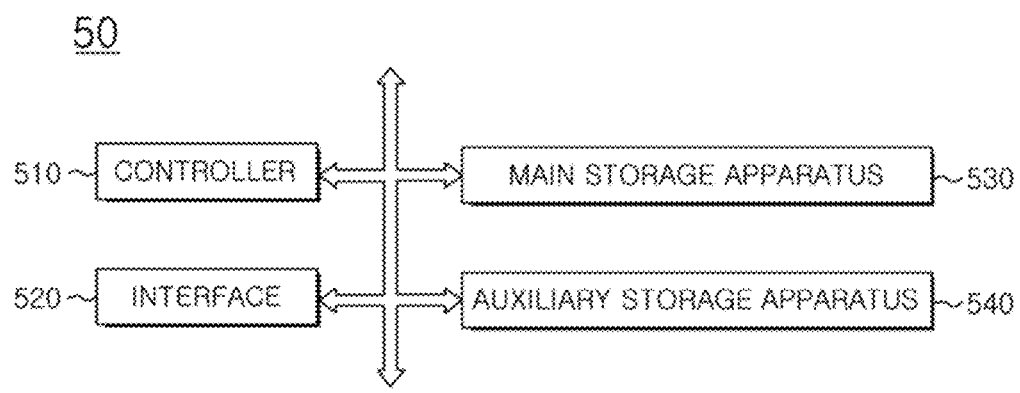
FIGS. 12 and 13 illustrate configurations of exemplary data processing systems.
Figure 13:
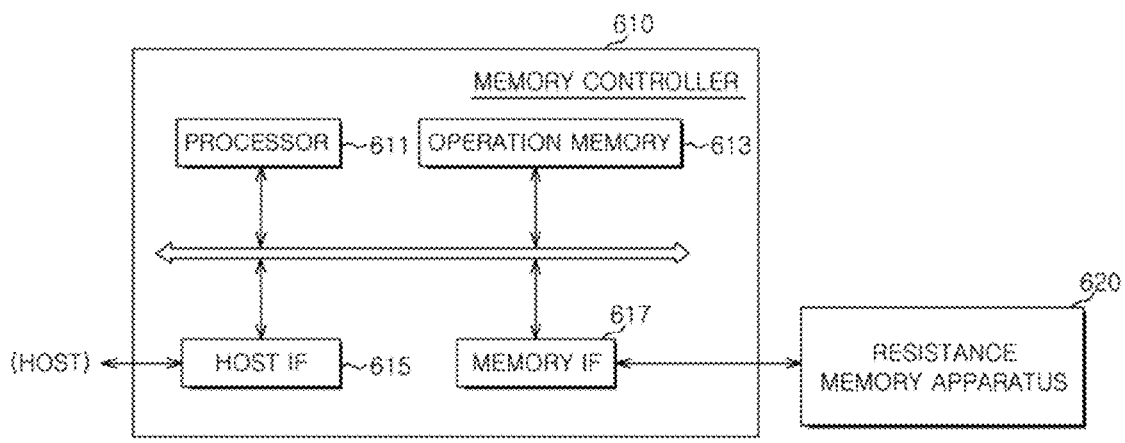

FIGS. 12 and 13 illustrate exemplary data processing systems.

A data processing system 50, illustrated in FIG. 12, may include a controller 510, an interface 520, a main storage apparatus 530, or an auxiliary storage apparatus 540.

The data processing apparatus 50 may perform input, processing, output, communication, storage, or the like to perform a series of operations for data processing, and may be an electronic apparatus such as a computer server, a personal portable terminal, a portable computer, a web tablet computer, a wireless terminal, a mobile communication terminal, a digital content player, a camera, a satellite navigation device, a video camera, a recorder, a telematics device, an audio/video (AV) system, or a smart television (TV).

In another exemplary implementation, the data processing system 50 may be a disc-type data storage apparatus, such as a hard disc, an optical drive disc, a solid-state disc, or a digital versatile disc (DVD), or a card type such as a universal serial bus (USB) memory, a secure digital (SD) card, a memory stick, a smart media card, an internal/external multimedia card, or a compact flash card.

A controller 510 may control data exchange between the main storage apparatus and the interface 530, and thus control an overall operation such as decryption of commands input through the interface 520 from the outside or an operation or comparison of data stored in the system.

The interface 520 may provide an environment for exchange of a command and data between an external apparatus and the data processing system 50. According to an application environment of the data processing system 50, the interface 520 may be a man-machine interface device including an input device (a keyboard, a key pad, a mouse, a voice recognition device, and the like) and an output device (a display, a speaker, and the like), a card interface device, a disc interface device (Integrated Drive Electronics (IDE), Small Computer System Interface (SCSI), Serial Advanced Technology Attachment (SATA), External SATA (eSATA), Personal Computer Memory Card International Association (PCMCIA), and the like), or the like.

The main storage apparatus 530 may function as a storage location configured to store an application, a control signal, data, or the like, required for an operation of the data processing system 50, and may bring and may execute a program or data from the auxiliary storage apparatus 540. The main storage apparatus 530 may be implemented using a memory apparatus having non-volatility and, for example, the resistance memory apparatus illustrated in FIG. 7 may be used.

The auxiliary storage apparatus 540 may be an area configured to hold a program code or data, and may be a high-capacity storage apparatus. As the auxiliary storage apparatus 540, for example, the resistance memory apparatus illustrated in FIG. 7 may be used.

That is, the main storage apparatus 530 and the auxiliary storage apparatus 540 may be implemented, for example, by introducing the resistance memory apparatus 30, illustrated in FIG. 7, including a memory cell array configured of the resistance memory device illustrated in FIG. 1 or 2. In other words, the main storage apparatus 530 may be a memory apparatus having a structure in which a memory device, which may include a data storage unit of which one end is connected to a bit line and first and second access devices connected in series between the data storage unit and a source line and configured to be driven by first and second word lines, respectively, is formed as a unit memory cell, the first word lines are commonly connected to first access devices of memory cells, and the second word lines are commonly connected to second access devices of the memory cells.

An exemplary data processing system 60, illustrated in FIG. 13, may include a memory controller 610 and a resistance memory apparatus 620.

The memory controller 610 may be configured to access the resistance memory apparatus 620 in response to request of a host. The memory controller 610 may include a processor 611, an operation memory 613, a host interface 615, or a memory interface 617.

The processor 611 may control an overall operation of the memory controller 610, and the operation memory may store an application, data, a control signal, or the like, required for operation of the memory controller 610.

The host interface 615 may perform protocol conversion for data/control signal exchange between the host and the memory controller 610, and the memory interface 617 may perform protocol conversion for data/control signal exchange between the memory controller 610 and the resistance memory apparatus 620.

The resistance memory apparatus 620 may be a memory apparatus having a structure in which a memory device, which may include a data storage unit of which one end is connected to a bit line and first and second access devices connected in series between the data storage unit and a source line and configured to be driven by first and second word lines, respectively, is formed as a unit memory cell, the first word lines are commonly connected to first access devices of memory cells, and the second word lines are commonly connected to second access devices of the memory cells, and for example, the memory apparatus illustrated in FIG. 7 may be used.

The data processing system illustrated in FIG. 13 may be used as a disc apparatus, an internal/external memory card of a portable electronic apparatus, an image processor, or another application chipset.

The operation memory provided in the memory controller 610 may be implemented using the memory apparatus illustrated in FIG. 7.

Figure 14:
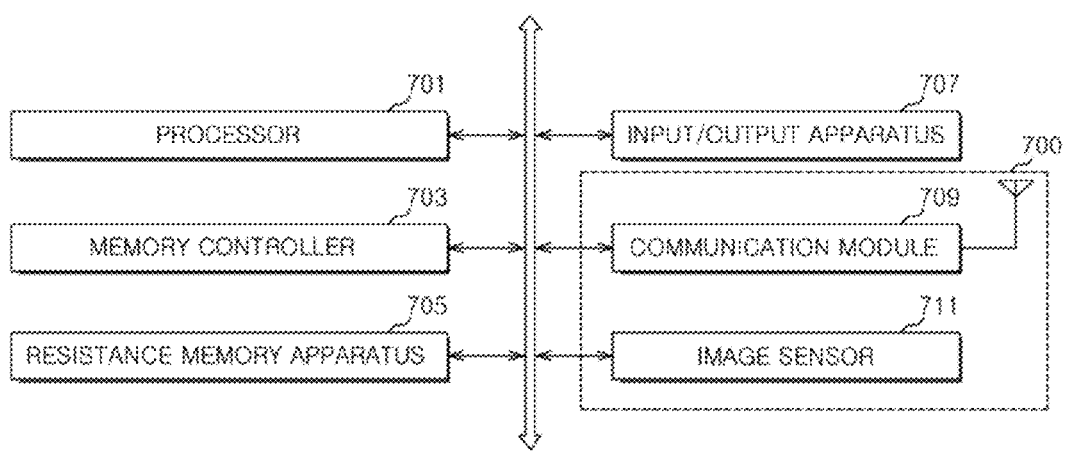
FIGS. 14 and 15 illustrate configurations of exemplary electronic systems.
Figure 15:
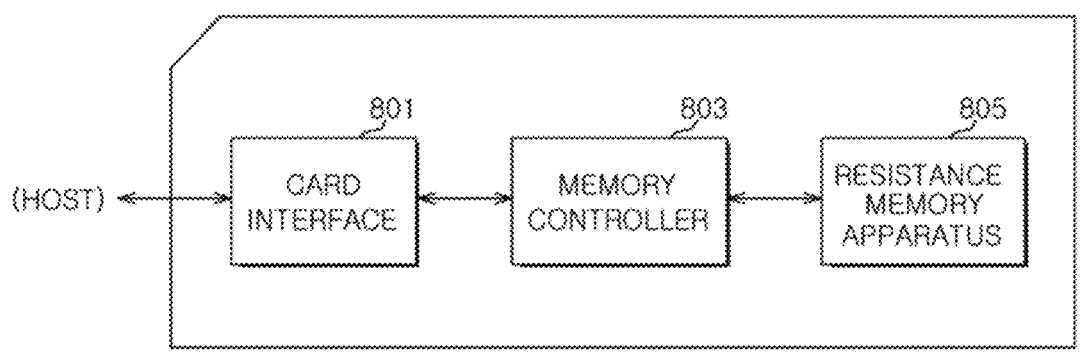

FIGS. 14 and 15 illustrate exemplary electronic systems.

An electronic apparatus 70, illustrated in FIG. 14, may include a processor 701, a memory controller 703, a resistance memory apparatus 705, an input/output apparatus 707, or a function module 700.

The memory controller 703 may control a data processing operation of the resistance memory apparatus 705, for example, a program operation, a read operation, or the like according to control of the processor 701.

Data programmed in the resistance memory apparatus 705 may be output through the input/output apparatus 707, according to control of the processor 701 and the memory controller 703. Thus, the input/output apparatus 707 may include a display device, a speaker device, or the like.

The input/output apparatus 707 may also include an input device, and may receive a control signal for controlling an operation of the processor 701 or data to be processed by the processor 701 through the input device.

In another implementation, the memory controller 703 may be implemented as a portion of the processor 701 or as a separate chipset from the processor 701.

The resistance memory apparatus 705 may be a memory apparatus having a structure in which a memory device, which may include a data storage unit of which one end is connected to a bit line and first and second access devices connected in series between the data storage unit and a source line and configured to be driven by first and second word lines, respectively, is formed as a unit memory cell, the first word lines are commonly connected to first access devices of memory cells, and the second word lines are commonly connected to second access devices of the memory cells, and for example, the memory apparatus illustrated in FIG. 7 may be used.

The function module 700 may be a module configured to perform a function selected according to an application example of the electronic system 70 illustrated in FIG. 14, and FIG. 14 illustrates a communication module 709 and an image sensor 711 as an example.

The electronic system 70 may connect a wired or wireless communication network so that the communication module 709 may provide a communication environment for exchange of data and control signal.

The image sensor 711 may convert an optical image into digital image signals and transfer the digital image signals to the processor 701 and the memory controller 703.

When the communication module 709 is provided, an electronic system 70 illustrated in FIG. 14 may be a portable communication apparatus, such as a wireless communication terminal. When the image sensor 711 is provided, the electronic system 70 may be a digital camera, a digital camcorder, or an electronic system (a personal computer (PC), a laptop computer, a mobile communication terminal, or the like, to which any one of the digital camera and the digital camcorder is attached.

An electronic system 80, illustrated in FIG. 15, may include a card interface 801, a memory controller 803, or a resistance memory apparatus 805. The electronic system 80 may include a memory card or a smart card. The electronic system 80 may include a PC card, a multimedia card, an embedded multimedia card, an SD card, or a USB drive.

The card interface 801 may perform interfacing on data exchange between a host and the memory controller 803 according to a protocol of the host. In an implementation, the card interface 801 may be defined as hardware for supporting a protocol used by the host, software installed in the hardware for supporting a protocol used by a host, or a signal transfer method.

The memory controller 803 may control data exchange between the resistance memory apparatus 805 and the card interface 801.

As the resistance memory apparatus 805, the memory apparatus illustrated in FIG. 7 may be used. That is, the resistance memory apparatus 805 may be a memory apparatus having a structure in which a memory device, which may include a data storage unit of which one end is connected to a bit line and first and second access devices connected in series between the data storage unit and a source line and configured to be driven by first and second word lines, respectively, is formed as a unit memory cell, the first word lines are commonly connected to first access devices of memory cells, and the second word lines are commonly connected to second access devices of the memory cells.

The above implementation of the present invention is illustrative and not limitative. Various alternatives and equivalents are possible. The invention is not limited by the implementation described herein. Nor is the invention limited to any specific type of semiconductor device. Other additions, subtractions, or modifications are obvious in view of the present disclosure and are intended to fall within the scope of the appended claims.

What is claimed is:

1. A resistance memory device, comprising:
a data storage unit;
a first interconnection connected to the data storage unit;
a first access device connected in series with the data storage unit;
a second access device connected in series with the first access device;
a second interconnection connected to the second access device;
a third interconnection connected to the first access device to drive the first access device;
a fourth interconnection connected to the second access device to drive the second access device, wherein the data storage unit, the first access device and the second access device are formed as a unit memory cell.

2. The resistance memory device of claim 1, wherein the first interconnection is a bit line, and the second interconnection is a source line.

3. The resistance memory device of claim 1, wherein the third interconnection is a first word line, and the fourth interconnection is a second word line.

4. The resistance memory device of claim 1, wherein the data storage unit includes a phase-change material, a perovskite, or a transition metal oxide.

5. The resistance memory device of claim 1, wherein the first access device and the second access device include an NMOS transistor.

6. The resistance memory device of claim 1, wherein the first access device and the second access device include a PMOS transistor.

7. A resistance memory apparatus, comprising:
a resistance memory cell array including a plurality of memory cells, each memory cell comprising:
a data storage connected to a bit line, and
a first access device and a second access device, connected in series with the data storage unit, and between the data storage unit and a source line, wherein the first access device is configured to be driven by a signal applied to a first word line and the second access device is configured to be driven by a signal applied to a second word line;
a controller configured to control a write operation and a read operation to a selected memory cell of the resistance memory cell array; and
a read/write control circuit configured to select at least one memory cell, of the resistance memory cell array, in response to the controller and to perform the write operation or the read operation,
wherein the data storage unit, the first access device and the second access device are formed as a unit memory cell.

8. The resistance memory apparatus of claim 7, wherein the first access devices, of the plurality of unit memory cells, are commonly connected to the first word line, and
wherein the second access devices, of the plurality of unit memory cells, are commonly connected to the second word line.

9. The resistance memory apparatus of claim 7, wherein the storage unit may include a phase-change material, a perovskite, or a transition metal oxide.

10. A processor comprising:
a controller configured to receive a signal from an external source and to control overall operation;
an operation unit configured to perform an operation according to a command decryption result of the controller; and
a storage unit configured to store data and an address used for operations of the controller and the operation unit,
wherein the storage unit comprises:
a resistance memory apparatus including a resistance memory cell array having a data storage unit of which one end is connected to a bit line, and a first access device and a second access device connected in series between the other end of the data storage unit and a source line and configured to be driven according to signals applied to a first word line and a second word line, as a unit memory cell.

11. The processor of claim 10, wherein first access devices of unit memory cells constituting the resistance memory cell array are commonly connected to the first word line, and second access devices of the unit memory cells are commonly connected to the second word line.

12. A data processing system comprising:
a controller configured to receive a signal from an external source and to control overall operation;
an interface configured to communicate the command or data to be exchanged between the external source and the controller;
a main storage apparatus configured to store an application, a control signal, or data; and
an auxiliary storage apparatus configured to store a program code or data,
wherein any one of the main storage apparatus or the auxiliary storage apparatus comprises:
a resistance memory apparatus including a resistance memory cell array having a data storage unit of which one end is connected to a bit line, and a first access device and a second access device connected in series between the other end of the data storage unit and a source line and configured to be driven according to signals applied to a first word line and a second word line, as a unit memory cell.

13. The data processing system of claim 12, wherein first access devices are commonly connected to the first word line, and second access are commonly connected to the second word line.

14. The data processing system of claim 12, wherein the interface is a user interface device, a card interface device, and a disc interface device.

15. A data processing system comprising:
a resistance memory apparatus including a resistance memory cell array, and a controller configured to control an operation of the resistance memory cell array; and
a memory controller configured to access the resistance memory apparatus in response to request of a host,
wherein the memory cell array includes:
a data storage unit connected to a bit line, and
a first access device and a second access device, which unit a unit memory cell, connected in series between the data storage unit and a source line, wherein the first access device is configured to be driven by a signal applied to a first word line, and the second access device is configured to be driven by a signal applied to a second word line.

16. The data processing system of claim 15, wherein the resistance memory cell array is configured to comprise a plurality of memory cell, and the first access device of the plurality of memory cell is mutually connected to the first word line, and the second access device of the plurality of memory cell is mutually connected to the second word line.

17. The data processing system of claim 15, wherein the memory controller comprises:
a processor configured to perform decryption of a command from the host and to process the command;
an operation memory configured to store an application, data, or a control signal required by the memory controller;
a host interface configured to perform protocol conversion for data and a control signal exchange between the host and the memory controller; and
a memory interface configured to perform protocol conversion for data and a signal exchange between the memory controller and the resistance memory apparatus.

18. An electronic system comprising:
a processor configured to perform decryption of a command from an external source and to process the command;

an operation memory configured to store an application, data, or a control signal required for an operation of the processor;

a resistance memory apparatus including:
- a memory cell array configured to be accessed by the processor, and
- a controller configured to control an operation of the memory cell array; and a user interface configured to input/output data between the processor and a user, wherein the memory cell array may include a data storage unit connected to a bit line, and a first access device and a second access device, which form a unit memory cell, connected in series between the data storage unit and a source line, wherein the first access device is configured to be driven by a signal applied to a first word line, and the second access device is configured to be driven by a signal applied to a second word line.

19. The electronic system of claim 18, wherein first access device is commonly connected to the first word line, and the second access device is commonly connected to the second word line.

20. The electronic system of claim 18, further comprising:
a communication module configured to access a wired or wireless communication network.

21. The electronic system of claim 18, further comprising:
an image sensor configured to convert an optical image into an image signal and transfer the image signal to the processor.

22. A method of operating a resistance memory apparatus including a resistance memory cell array including a data storage unit, of which one end is connected to a bit line, and a first access device and a second access device, connected in series between another end of the data storage unit and a source line and configured to be driven according to signals applied to a first word line and a second word line, as a unit memory cell; and a controller configured to control a write operation and a read operation to a selected memory cell among the resistance memory cell array, the method comprising:

supplying a voltage having a first level to the bit line, the source line, the first word line, and the second word line;

supplying a first power voltage, having a level higher than the first level, to the first word line;

supplying a voltage, having a level lower than the first level, to the second word line;

supplying a second power voltage, having a level higher than the first power voltage, to a selected bit line;

supplying the voltage having the first level to a selected source line; and accessing a selected memory cell by supplying the voltage of the first level to a non-selected bit line, and supplying a voltage of a second level that is lower than the first power voltage and higher than the first level to a non-selected source line.

23. The method of claim 22, further comprising:
storing data by supplying a first program voltage or a second program voltage to the selected bit line after the accessing of the selected memory cell.

24. The method of claim 22, further comprising:
reading out data by supplying a read voltage to the selected bit line after the accessing of the selected memory cell.

25. A method of fabricating a resistance memory device, the method comprising:

sequentially forming a first conductive material, a first interlayer insulating layer, a second conductive material, and a second interlayer insulating layer on a semiconductor substrate in which a source line is formed;

patterning the first conductive material and the second conductive material and the first interlayer insulating layer and the second interlayer insulating layer to form a plurality of first holes exposing an upper surface of the source line;

forming a gate insulating layer on an inner wall defining each of the first holes;

forming a channel region in each of the first holes in which the gate insulating layer is formed;

forming a junction region by implanting an impurity in an upper portion of the channel region;

forming a third interlayer insulating layer on the semiconductor substrate, including the junction region;

patterning the third interlayer insulating layer to form second holes exposing an upper portion of the junction region;

forming a data storage unit in an inside of the second holes; and forming a bit line to be electrically connected to the data storage unit.

26. The method of claim 25, wherein the data storage unit includes a phase-change material, a perovskite, or transition metal oxide.

27. The method of claim 25, wherein the bit line is formed in a direction perpendicular to the source line.

* * * * *